United States Patent
Kim et al.

(10) Patent No.: US 12,276,114 B2
(45) Date of Patent: Apr. 15, 2025

(54) METHOD FOR JOINT CONSTRUCTION OF ELECTROMAGNETIC SHIELDING FLEXIBLE SHEET

(71) Applicant: ELECTRONICS AND TELECOMMUNICATIONS RESEARCH INSTITUTE, Daejeon (KR)

(72) Inventors: Dae-Yeon Kim, Daejeon (KR); Dae-Heon Lee, Daejeon (KR); Seung-Kab Ryu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 317 days.

(21) Appl. No.: 17/715,279

(22) Filed: Apr. 7, 2022

(65) Prior Publication Data

US 2023/0193634 A1    Jun. 22, 2023

(30) Foreign Application Priority Data

Dec. 22, 2021  (KR) .................. 10-2021-0184850

(51) Int. Cl.
  *E04F 13/08*  (2006.01)
  *E04B 1/92*  (2006.01)
  *H05K 9/00*  (2006.01)
(52) U.S. Cl.
  CPC ............ *E04F 13/0887* (2013.01); *E04B 1/92* (2013.01); *H05K 9/0003* (2013.01);
  (Continued)

(58) Field of Classification Search
  CPC .............. E04F 13/0887; E04F 2201/07; E04F 2290/04; E04B 1/92; E04B 2001/925;
  (Continued)

(56) References Cited

U.S. PATENT DOCUMENTS 4,750,957 A  *  6/1988  Gustafson ............ H05K 9/0015
                                                    156/92
6,548,196 B2    4/2003  Ha et al.
(Continued)

FOREIGN PATENT DOCUMENTS

GB        2422384 A  *  7/2006
JP     H11103188 A  *  4/1999
(Continued)

OTHER PUBLICATIONS

JP 2004339853A Machine Translation of Description (Year: 2024).*
JPH11103188A Machine Translation of Description (Year: 2024).*

*Primary Examiner* — Cynthia L Schaller
(74) *Attorney, Agent, or Firm* — LRK PATENT LAW FIRM

(57) ABSTRACT

Disclosed herein is a method for constructing a joint between thin flexible sheets of electromagnetic shielding material. The method includes adhering first sides of multiple first sheets of shielding material to a wall and adhering first sides of multiple second sheets of shielding material to second sides of the multiple first sheets of shielding material. A conductive adhesive or a conductive double-sided adhesive tape may be applied to the first side of each of the first sheets of shielding material and the second sheets of shielding material, the first sheets of shielding material may be arranged to abut each other along at least one first seam, and the second sheets of shielding material may be arranged to abut each other along at least one second seam.

8 Claims, 14 Drawing Sheets

(52) U.S. Cl.
CPC ..... *E04B 2001/925* (2013.01); *E04F 2201/07* (2013.01); *E04F 2290/04* (2013.01)

(58) Field of Classification Search
CPC .. H05K 9/0003; H05K 9/0009; H05K 9/0084; H05K 3/368
See application file for complete search history.

(56) References Cited

U.S. PATENT DOCUMENTS

| | | | |
|---|---|---|---|
| 11,005,175 | B2 | 5/2021 | Lim et al. |
| 2013/0236723 | A1* | 9/2013 | Ishiguro .................... C08J 5/18 |
| | | | 525/190 |
| 2019/0269045 | A1* | 8/2019 | Carroll .............. E04F 15/02016 |

FOREIGN PATENT DOCUMENTS

| | | |
|---|---|---|
| JP | 2004-339853 A | 12/2004 |
| KR | 10-2003-0083213 A | 10/2003 |
| KR | 10-0416692 B1 | 1/2004 |
| KR | 10-0743145 B1 | 7/2007 |
| KR | 10-2009-0111126 A | 10/2009 |
| KR | 10-1571999 B1 | 11/2015 |
| KR | 10-1882167 B1 | 7/2018 |
| KR | 10-1902714 B1 | 10/2018 |
| KR | 10-1939664 B1 | 1/2019 |
| KR | 10-2008955 B1 | 8/2019 |

* cited by examiner

METHOD FOR JOINT CONSTRUCTION OF ELECTROMAGNETIC SHIELDING FLEXIBLE SHEET

CROSS REFERENCE TO RELATED APPLICATION

This application claims the benefit of Korean Patent Application No. 10-2021-0184850, filed Dec. 22, 2021, which is hereby incorporated by reference in its entirety into this application.

BACKGROUND OF THE INVENTION

1. Technical Field

The disclosed embodiment relates to a method for constructing a facility shielded from electromagnetic waves in order to prevent important electronic equipment from being damaged by electromagnetic waves.

2. Description of Related Art

An electromagnetic shielded facility is a facility shielded against high-power electromagnetic waves incident from the outside, and the construction method thereof varies depending on the required performance and the characteristics thereof.

Among the components of such a shielded facility, six surfaces, including walls, a ceiling, and a floor, play a role of blocking electromagnetic waves to the greatest extent possible.

The material of the wall surfaces may include a galvanized steel sheet, a steel sheet, and the like, which are metallic materials. Depending on the size of the facility, it is necessary to join pieces of such material, and this is called shielding material joint construction.

Electromagnetic waves have a characteristic in that they can penetrate through even narrow physical gaps in a wall, and shielding material joint construction for removing or minimizing a gap in a shielded facility, which requires high shielding performance, affects the overall stability of the facility. Currently, two joint construction techniques, namely welded joint construction and modular joint construction, are commonly used in military/commercial facilities.

The welded joint construction technique is a method for preventing cracks by connecting steel sheets to match the size of a facility by directly welding the steel sheets, and may convey a high shielding effect. However, because the thickness of the steel sheet is required to be at least 16 gauge (1.29 mm), it is difficult to construct joints, and initial costs, maintenance costs, and management costs are very high.

The modular joint construction technique, which results in a lightweight structure compared to the welding technique, may be divided into two types. The first type is a modular panel method in which a steel sheet is adhered to one or both sides of plywood or a particleboard panel, and the plywood or the particleboard panel is fastened to a clamp frame using bolts. The second type is a modular pan type method in which the end portion of a single steel sheet is bent in a C shape and connection is achieved by fastening a bolt with a nut.

The modular joint construction technique has a disadvantage in that performance is degraded, compared to when sheets of material are directly connected to each other, because a crack or the like can be generated by joining frames using a bolt and a nut, but has the advantages of a short construction period and low cost.

Meanwhile, recent technological development has led to improvements in the shielding performance of a thin-film-type shielding material (having a thickness of tens of micrometers ($\mu$m)), which suggests the possibility of applying a thin-film-type shielding material to an electromagnetic shielded facility. When such a thin-film-type shielding material is produced in the form of a sheet by applying a conductive adhesive or a conductive double-sided adhesive tape to one side thereof, a lightweight electromagnetic shielded facility may be constructed merely by covering the wall surfaces of an existing office or server room with the sheet using a general papering method. Here, there is a limit on the width to which a shielding material that can be produced depending on the manufacturing process. The maximum width of a thin-film soft magnetic shielding material is 200 mm due to process limitations. The maximum width of other thin-film shielding materials that can be produced is about 1.1 m, and even if a thin-film shielding material can be produced into a sheet having a width greater than that, it would still be impossible to produce the same to have a width that is sufficient to cover the entire wall surface without a joint. That is, it is essential to construct a joint for connecting sheets of material in order to cover the entire wall surface with material while ensuring shielding performance.

However, because the sheet is thin, it is difficult to apply existing techniques (a welding or modular method), and when the sheets are connected using a general papering method, shielding performance is degraded.

SUMMARY OF THE INVENTION

The disclosed embodiment intends to provide a lightweight and inexpensive method for applying a flexible thin-film shielding material to a wall surface, which can improve shielding performance by preventing the leakage of broadband electromagnetic waves (10 kHz to 18 GHz) through joints between the sheets of shielding material and which can simplify an installation method and minimize the number of additional components.

A method for constructing a joint between thin flexible sheets of electromagnetic shielding material according to an embodiment includes adhering first sides of multiple first sheets of shielding material to a wall and adhering first sides of multiple second sheets of shielding material to second sides of the multiple first sheets of shielding material. A conductive adhesive or a conductive double-sided adhesive tape may be applied to the first side of each of the first sheets of shielding material and the second sheets of shielding material, the first sheets of shielding material may be arranged to abut each other along at least one first seam, and the second sheets of shielding material may be arranged to abut each other along at least one second seam.

Here, the method may further include removing a non-conductive or weakly conductive coating from the first sheets of shielding material before adhering the first sides of the multiple second sheets of shielding material.

Here, the non-conductive or weakly conductive coating may be a protective film or a foreign substance.

Here, the at least one first seam may form a predetermined angle with the at least one second seam.

Here, the predetermined angle may fall within a range of 90°±10°.

Here, the first seam and the second seam may be spaced a fixed distance apart from each other so as to be parallel to each other.

The method may further include preprocessing a corner of walls by adhering a single sheet of third shielding material thereto before adhering the first sides of the multiple first sheets of shielding material to the wall; and postprocessing the corner of the walls by adhering a single sheet of fourth shielding material thereto after adhering the first sides of the multiple second sheets of shielding material.

A method for constructing a joint between thin flexible sheets of electromagnetic shielding material according to another embodiment includes adhering a first side of a first sheet of shielding material to a wall, spraying conductive powder to a predetermined area of a first side of a second sheet of shielding material, and adhering the first side of the second sheet of shielding material to the wall such that the predetermined area, to which the conductive powder is sprayed, overlaps a second side of the first sheet of shielding material. A conductive adhesive or a conductive double-sided adhesive tape may be applied to the first side of each of the first sheet of shielding material and the second sheet of shielding material.

Here, the conductive powder may be angular powder.

Here, the conductive powder may use one of a polymer, nanocarbon, and a metallic material.

The method may further include preprocessing a corner of walls by adhering a single sheet of third shielding material thereto before adhering the first side of the first sheet of shielding material to the wall; and postprocessing the corner of the walls by adhering a single sheet of fourth shielding material thereto after adhering the first side of the second sheet of shielding material.

A method for constructing a joint between thin flexible sheets of electromagnetic shielding material according to a further embodiment includes adhering a first side of a conductive adhesive tape to a wall, adhering a first side of a first sheet of shielding material to the wall so as to overlap a portion of a second side of the conductive adhesive tape, and adhering a first side of a second sheet of shielding material to the wall so as to overlap a remainder of the second side of the conductive adhesive tape and a portion of a second side of the first sheet of shielding material. A conductive adhesive or a conductive double-sided adhesive tape may be applied to the first side of each of the first sheet of shielding material and the second sheet of shielding material.

Here, the method may further include removing a coating from the second side of the conductive adhesive tape before adhering the first side of the first sheet of shielding material.

The method may further include preprocessing a corner of walls by adhering a single sheet of third shielding material thereto before adhering the first side of the conductive adhesive tape to the wall; and postprocessing the corner of the walls by adhering a single sheet of fourth shielding material thereto after adhering the first side of the second sheet of shielding material to the wall.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
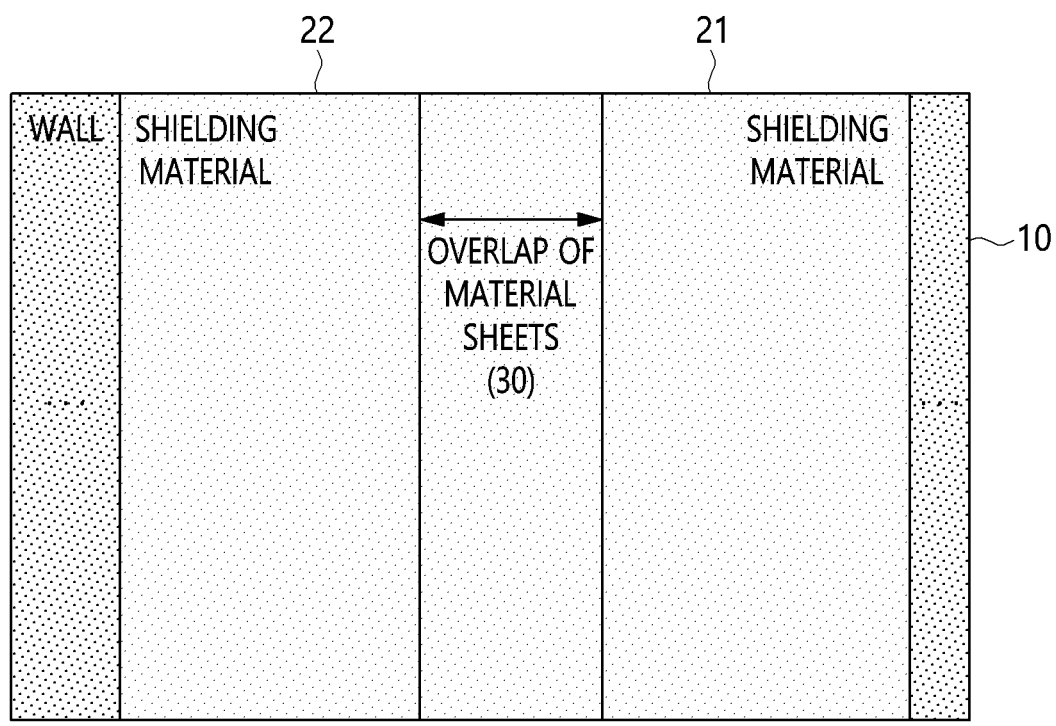
FIG. 1 is a plan view of a general structure of a joint between sheets of electromagnetic shielding material.

The advantages and features of the present invention and methods of achieving the same will be apparent from the exemplary embodiments to be described below in more detail with reference to the accompanying drawings. However, it should be noted that the present invention is not limited to the following exemplary embodiments, and may be implemented in various forms. Accordingly, the exemplary embodiments are provided only to disclose the present invention and to let those skilled in the art know the category of the present invention, and the present invention is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present invention.

The terms used herein are for the purpose of describing particular embodiments only, and are not intended to limit the present invention. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present invention pertains. Terms identical to those defined in generally used dictionaries should be interpreted as having meanings identical to contextual meanings of the related art, and are not to be interpreted as having ideal or excessively formal meanings unless they are definitively defined in the present specification.

Hereinafter, a method according to an embodiment will be described in detail with reference to FIGS. 1 to 18.

Figure 2:
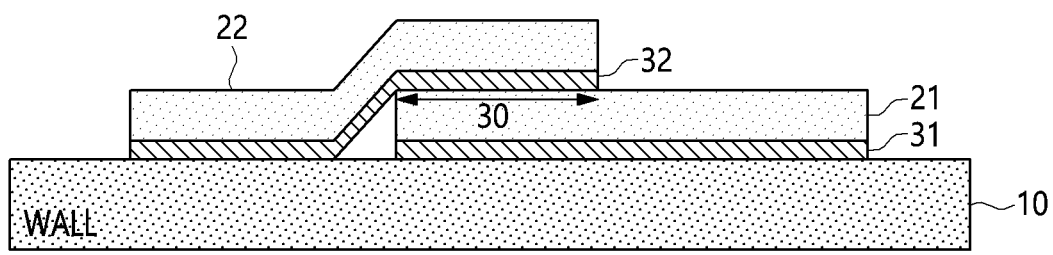
FIG. 2 is a cross-sectional view of the general structure of the joint between sheets of electromagnetic shielding material in FIG. 1.

FIG. 1 is a plan view of a general structure of a joint between sheets of electromagnetic shielding material, and FIG. 2 is a cross-sectional view of the general structure of the joint between sheets of electromagnetic shielding material in FIG. 1.

Referring to FIG. 1, two sheets of shielding material 21 and 22 are adhered to a wall 10 and joined through a general papering method using layers of conductive adhesive 31 and 32.

This method is simple, but the layers of conductive adhesive 31 and 32 have lower conductivity than the sheets of shielding material 21 and 22, and also have low adhesive strength. Accordingly, electromagnetic wave leakage may occur in the region 30 in which the sheets of shielding material overlap each other.

As described above, when compared with the shielding performance of a raw shielding material having no joints, the shielding performance of sheets of shielding material that are connected simply by overlapping them using a general papering method is degraded when the polarization of an incident electromagnetic wave is perpendicular to the direction in which the sheets overlap.

Therefore, if the above method is applied to a facility without additional measures, the lap joint between sheets of shielding material may be transmissive of electromagnetic waves, because electromagnetic waves can penetrate through even tiny gaps.

In order to solve this problem, it is required to physically join sheets of shielding material using welding or modules, but because a thin sheet of shielding material has a thickness of tens of micrometers (µm), it is not easy to join sheets of shielding material using welding, bolts, nuts, copper nails, or staplers.

Also, it is necessary to additionally construct a separate wall and structures, in addition to existing walls, which increases the construction period and cost.

Therefore, the present invention proposes various embodiments of a method for constructing a joint between thin flexible sheets of electromagnetic shielding material in order to solve the above-described problems.

First Embodiment

Figure 3:
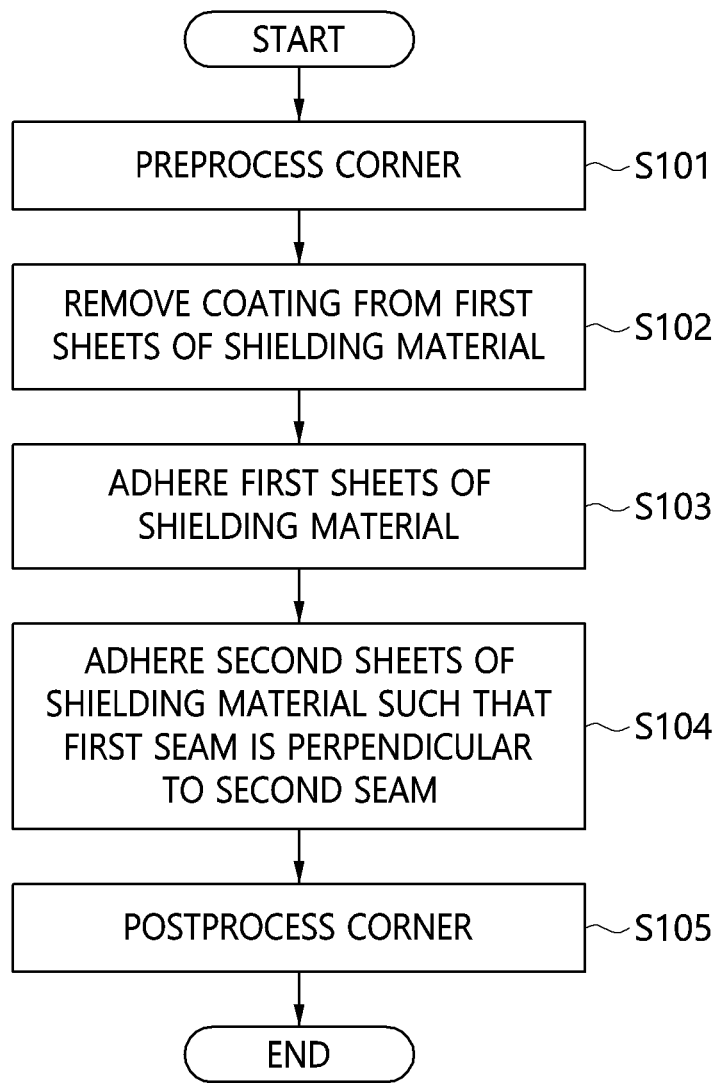
FIG. 3 is a flowchart for explaining a method for constructing a joint between thin flexible sheets of electromagnetic shielding material according to a first embodiment of the present invention.
Figure 4:
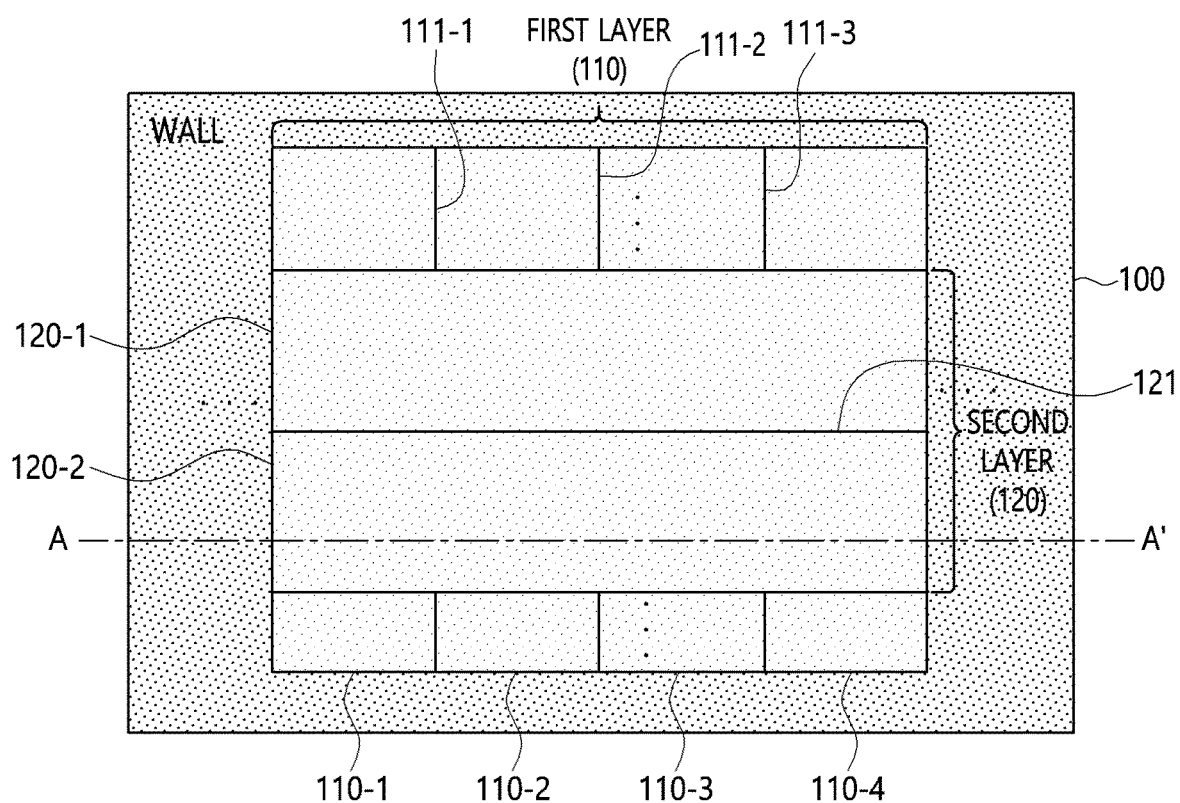
FIG. 4 is an example of a plan view of a facility in which a joint is constructed according to the first embodiment of the present invention.
Figure 5:
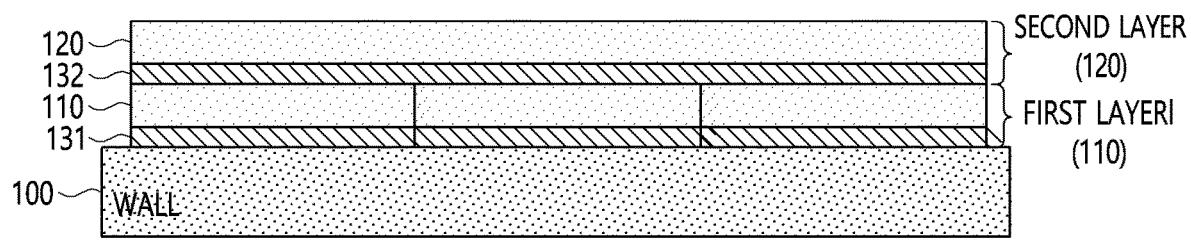
FIG. 5 is an example of a vertical cross-sectional view taken along the dotted line AA' in the plan view of FIG. 4.

FIG. 3 is a flowchart for explaining a method for constructing a joint between thin flexible sheets of electromagnetic shielding material according to a first embodiment of the present invention, FIG. 4 is an example of a plan view of a facility in which a joint is constructed according to the first embodiment of the present invention, and FIG. 5 is an example of a vertical cross-sectional view taken along the dotted line AA' in the plan view of FIG. 4.

Referring to FIG. 3, the method for constructing a joint between thin flexible sheets of electromagnetic shielding material according to the first embodiment may include adhering first sides of multiple first sheets of shielding material to a wall at step S103 and adhering first sides of multiple second sheets of shielding material to second sides of the multiple first sheets of shielding material at step S104.

That is, referring to FIG. 5, the first sheets of shielding material 110 form a first layer, and the second sheets of shielding material form a second layer, whereby a double-layered shielding structure may be constructed.

Here, the wall 100 may be the wall of a facility that needs be shielded from electromagnetic waves. However, a wall according to an embodiment may be variously interpreted as including the external surface of an object that has to be shielded from electromagnetic waves, without being limited to a wall of a building.

Meanwhile, a conductive adhesive or a conductive double-sided adhesive tape 131 or 132 may be applied to the first side of each of the first sheet of shielding material 110 and the second sheet of shielding material 120. For example, the first sheet of shielding material 110 and the second sheet of shielding material 120 may be produced in the form of sheets such that even laymen can easily construct a joint.

Referring to FIG. 4, the first sheets of shielding material 110-1, 110-2, 110-3, and 110-4 may be arranged to abut each other along one or more first seams 111-1, 111-2, and 111-3.

Alternatively, the first sheets of shielding material 110-1, 110-2, 110-3 and 110-4 may be arranged to partially overlap each other.

Also, the second sheets of shielding material 120-1 and 120-2 may be arranged to abut each other along at least one second seam 121.

Alternatively, the second sheets of shielding material 120-1 and 120-2 may be arranged to partially overlap each other. To this end, the first sheets of shielding material 110-1, 110-2, 110-3, and 110-4 and the second sheets of shielding material 120-1 and 120-2 may be produced to have the same rectangular shapes, as illustrated in FIG. 4.

Also, although four first sheets of shielding material and two second sheets of shielding material are illustrated in FIG. 4, these are merely for helping understanding of the present invention, and the present invention is not limited thereto.

Meanwhile, according to the first embodiment of the present invention, the multiple sheets of shielding material may be adhered after being arranged such that the one or more first seams form a predetermined angle with the at least one second seam at step S104.

Here, the predetermined angle may fall within a range of 90°±10°.

Referring to FIG. 4, an example in which the first seams 111-1, 111-2, and 111-3 are perpendicular to the second seam 121 is illustrated. However, this is merely an example, and the present invention is not limited thereto. That is, the first seam only needs to be blocked by the second sheet of shielding material, and the second seam only needs to be blocked by the first sheet of shielding material, so it may be desirable to set the predetermined angle to 90°.

Meanwhile, referring to FIG. 3 again, in the method for constructing a joint between thin flexible sheets of electromagnetic shielding material according to the first embodiment, removing a non-conductive or weakly conductive coating from the second sides of the first sheets of shielding material may be further performed at step S102 before adhering the first sides of the multiple second sheets of shielding material is performed at step S104. That is, the surface of the conductive material of the first sheets of shielding material may be exposed.

Here, the non-conductive or weakly conductive coating may be a protective film or a foreign substance.

Meanwhile, the method for constructing a joint between thin flexible sheets of electromagnetic shielding material according to an embodiment is a method for the wall having a largest area when a shielded room or a shielded enclosure is constructed.

Figure 6:
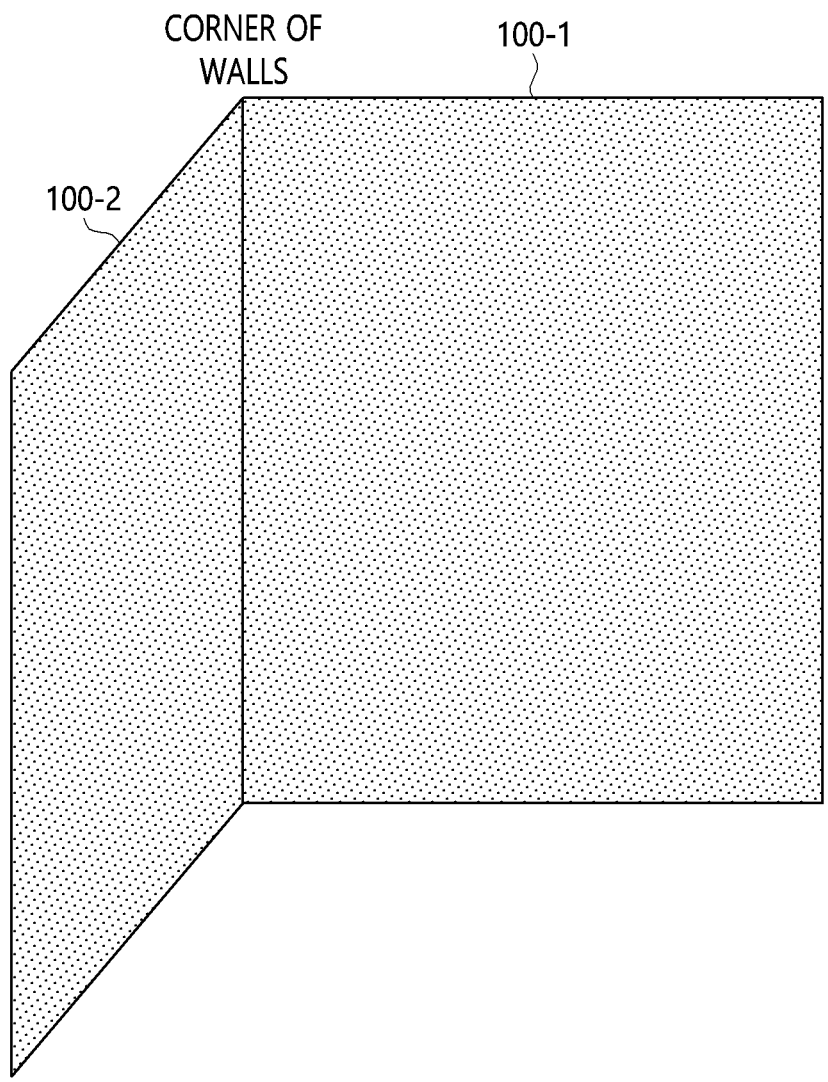
FIG. 6 is an exemplary view of the corner of walls of a shielded room or a shielded enclosure to which an embodiment is applied.

FIG. 6 is an exemplary view of the corner of walls of a shielded room or a shielded enclosure to which an embodiment is applied.

Referring to FIG. 6, when a shielded room is actually constructed, the corner where walls 100-1 and 100-2 meet is the part through which electromagnetic waves are likely to leak into the shielded room, or which is difficult to construct. Therefore, it is necessary to process the wall corners in order to facilitate construction and maintain the performance thereof.

To this end, referring to FIG. 3, the method for constructing a joint between thin flexible sheets of electromagnetic shielding material according to an embodiment may further include preprocessing the corner of walls by adhering a single sheet of third shielding material thereto at step S101.

Figure 7:
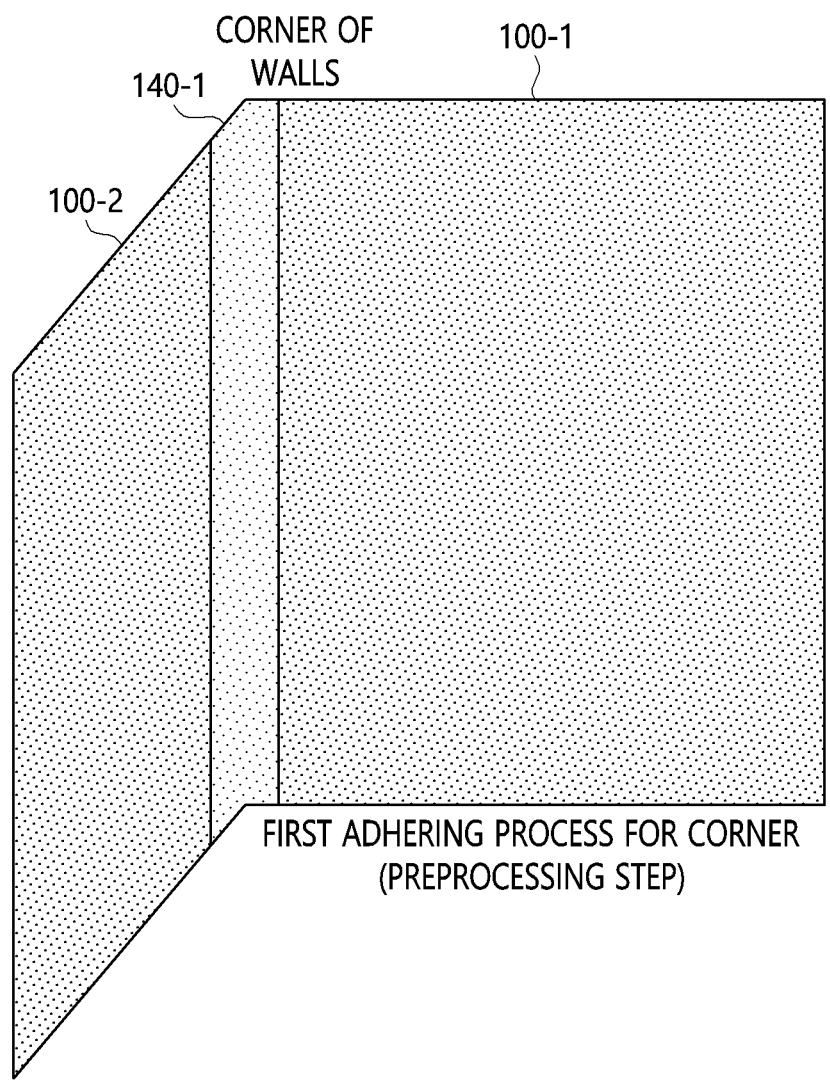
FIG. 7 is an exemplary view of a preprocessed corner of walls according to an embodiment.

FIG. 7 is an exemplary view of a preprocessed corner of walls according to an embodiment.

Referring to FIG. 7, a single sheet of third shielding material 140-1 is first adhered to the corner where walls 100-1 and 100-2 meet. That is, the single sheet of third shielding material 140-1 is adhered to an area, including the edges of the walls and a portion of the surfaces thereof (two surfaces or three surfaces), whereby the edges of the walls are connected through the single sheet of third shielding material 140-1.

Here, the third shielding material 140-1 may be made of the same material as the first sheet of shielding material 110 or the second sheet of shielding material 120.

Subsequently, steps S102 to S104 described above may be performed.

Figure 8:
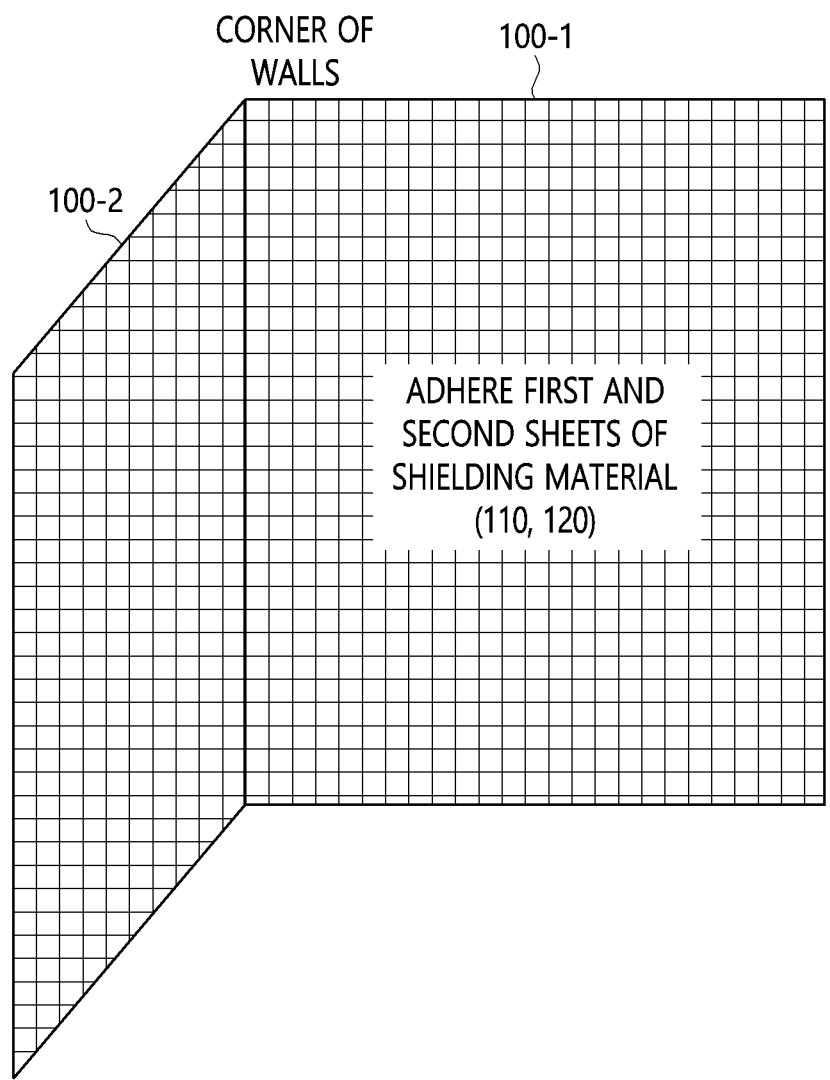
FIG. 8 is an exemplary view of a wall in which a joint between sheets of shielding material is constructed according to an embodiment.

FIG. 8 is an exemplary view of walls in which a joint between sheets of shielding material is constructed according to an embodiment.

Referring to FIG. 8, the first sheet of shielding material 110 and the second sheet of shielding material 120 may be adhered at steps S102 to S104 so as to cover the corner preprocessed at step S101, and the sheets of shielding material may be adhered to all of the six surfaces of the shielded room.

Referring to FIG. 3 again, the method for constructing a joint between thin flexible sheets of electromagnetic shielding material according to an embodiment may further include postprocessing the corner of walls by adhering a single sheet of fourth shielding material thereto at step S105 after steps S102 to S104 are performed.

Figure 9:
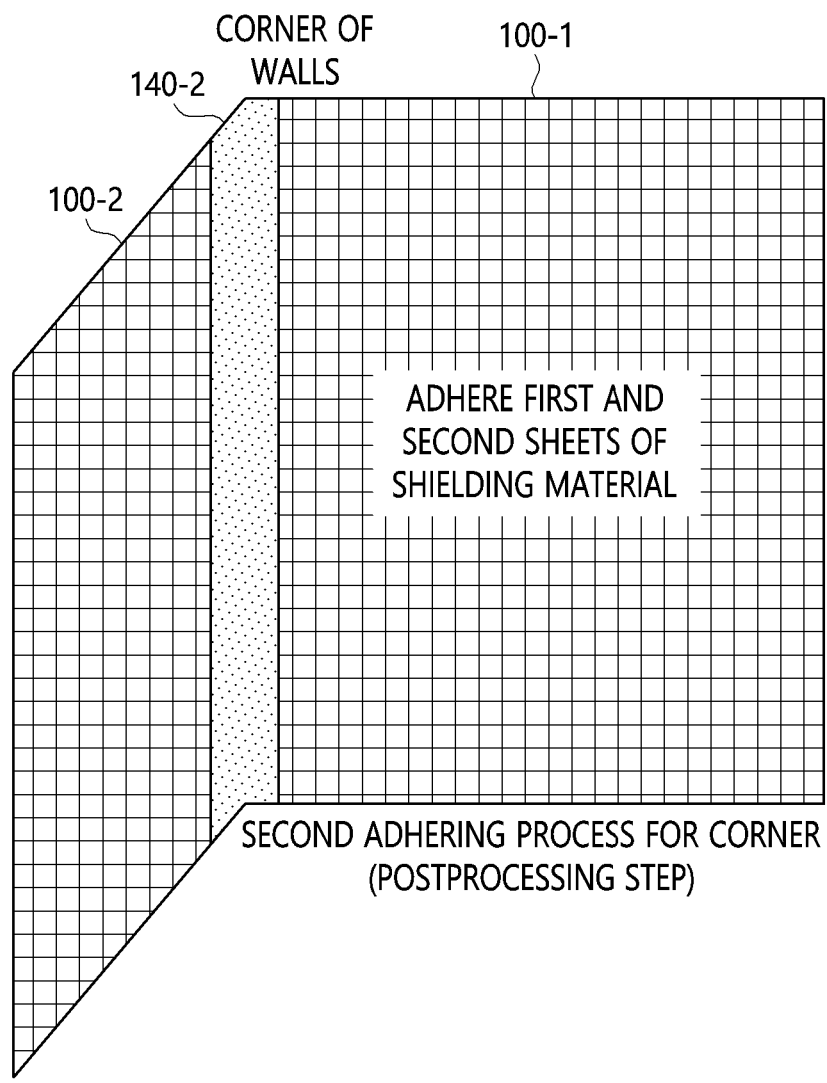
FIG. 9 is an exemplary view of a postprocessed corner of walls according to an embodiment.

FIG. 9 is an exemplary view of a postprocessed corner of walls according to an embodiment.

Referring to FIG. 9, a fourth shielding material 140-2 is additionally adhered to the corner where walls 100-1 and 100-2 meet. That is, the single sheet of fourth shielding material 140-2 is adhered to an area, including the edges of the walls and a portion of the surfaces thereof (two surfaces or three surfaces), whereby the edges of the walls are connected through the single sheet of fourth shielding material 140-2.

Here, the fourth shielding material 140-2 may be made of the same material as the first sheet of shielding material 110 or the second sheet of shielding material 120.

Step S105 described above is aimed at strengthening the shielding performance at the corner of walls after joint construction is performed at steps S102 to S104. That is, after a joint is constructed, a process of putting a shield over a leakage point may be added, and the process may be performed in consideration of the situation in which a shielding material is damaged during joint construction or in which adhesive strength is lowered at the joint, as well as performed at the corner of the walls.

Second Embodiment

Figure 10:
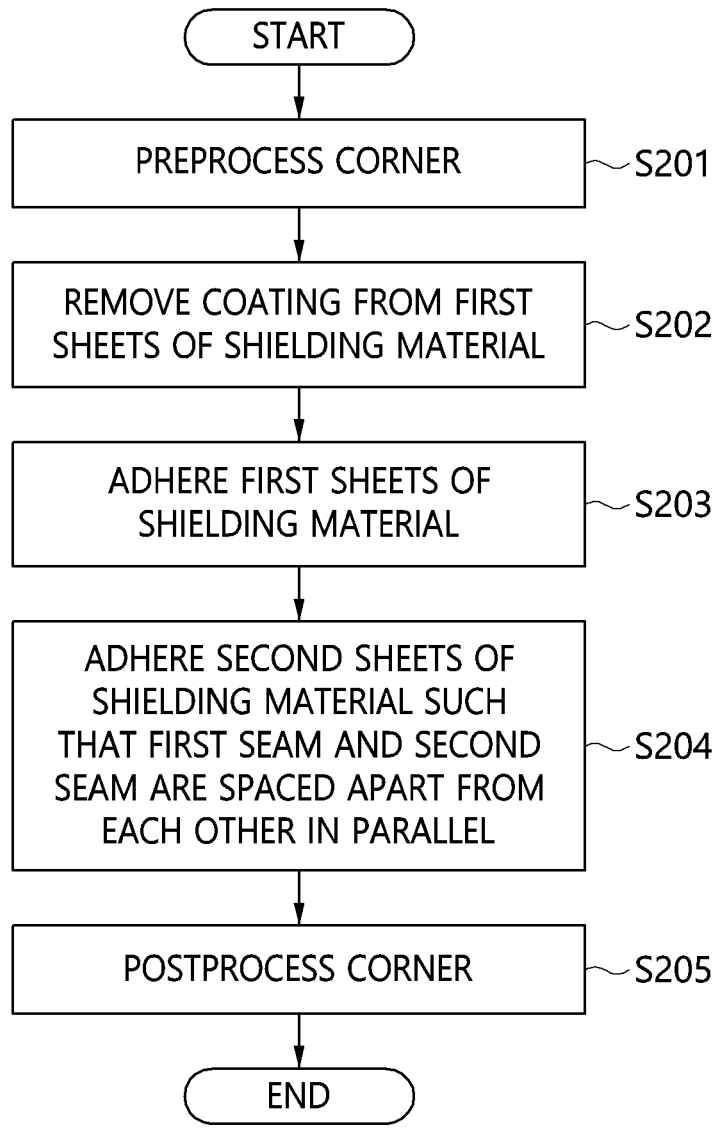
FIG. 10 is a flowchart for explaining a method for constructing a joint between thin flexible sheets of electromagnetic shielding material according to a second embodiment of the present invention.
Figure 11:
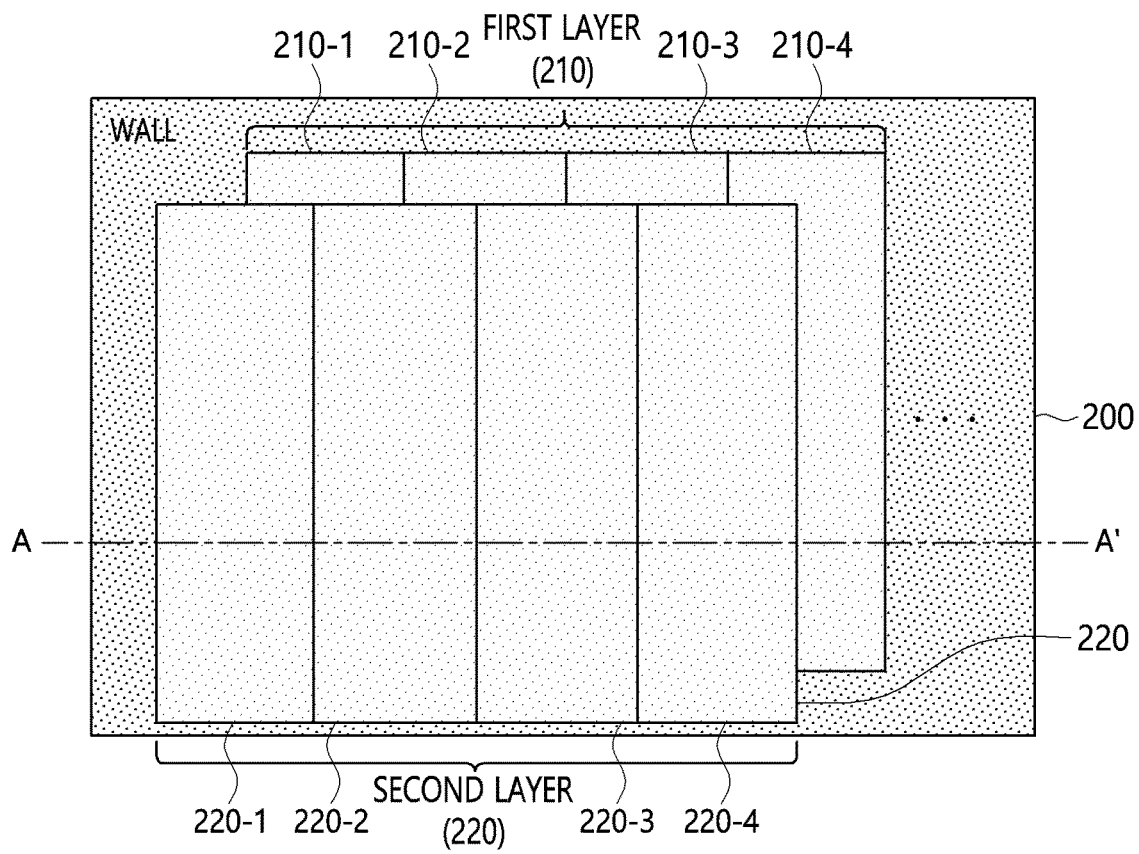
FIG. 11 is an example of a plan view of a facility in which a joint is constructed according to the second embodiment of the present invention.
Figure 12:
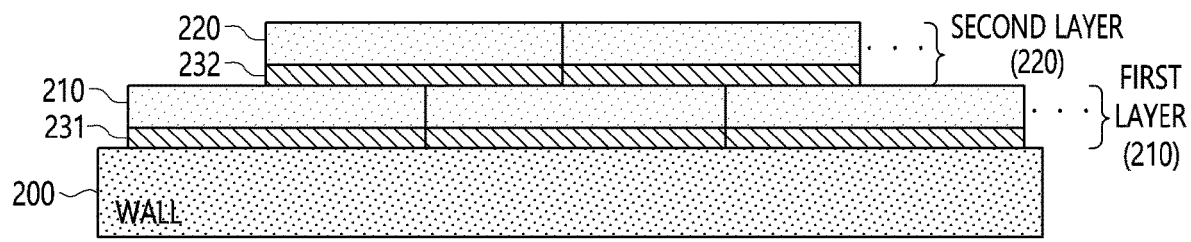
FIG. 12 is an example of a vertical cross-sectional view taken along the dotted line AA' in the plan view of FIG. 11.

FIG. 10 is a flowchart for explaining a method for constructing a joint between thin flexible sheets of electromagnetic shielding material according to a second embodiment of the present invention, FIG. 11 is an example of a plan view of a facility in which a joint is constructed according to the second embodiment of the present invention, and FIG. 12 is an example of a vertical cross-sectional view taken along the dotted line AA' in the plan view of FIG. 11.

Referring to FIG. 10, the method for constructing a joint between thin flexible sheets of electromagnetic shielding material according to the second embodiment may include adhering first sides of multiple first sheets of shielding material to a wall at step S203 and adhering first sides of multiple second sheets of shielding material to second sides of the multiple first sheets of shielding material at step S204.

That is, referring to FIG. 12, the first sheets of shielding material 210 form a first layer, and the second sheets of shielding material 220 form a second layer, whereby a double-layered shielding structure may be constructed.

Here, the wall 200 may be the wall of a facility that needs to be shielded from electromagnetic waves. However, a wall according to an embodiment may be variously interpreted as including the external surface of an object that has to be shielded from electromagnetic waves, without being limited to a wall of a building.

Meanwhile, a conductive adhesive or a conductive double-sided adhesive tape 231 or 232 may be applied to the first side of each of the first sheet of shielding material 210 and the second sheet of shielding material 220. For example, the first sheet of shielding material 210 and the second sheet of shielding material 220 may be produced in the form of sheets such that even laymen can easily construct a joint.

Referring to FIG. 11, the first sheets of shielding material 210-1, 210-2, 210-3, and 210-4 may be arranged to abut each other along one or more first seams 211-1, 211-2, and 211-3.

Alternatively, the first sheets of shielding material 210-1, 210-2, 210-3, and 210-4 may be arranged to partially overlap each other.

Also, the second sheets of shielding material 220-1, 220-2, 220-3, and 220-4 may be arranged to abut each other along one or more second seams 221-1, 221-2, and 221-3.

Alternatively, the second sheets of shielding material 220-1, 220-2, 220-3, and 220-4 may be arranged to partially overlap each other.

To this end, the first sheets of shielding material 210-1, 210-2, 210-3, and 210-4 and the second sheets of shielding material 220-1, 220-2, 220-3, and 220-4 may be produced to have the same rectangular shapes, as illustrated in FIG. 11.

Also, although four first sheets of shielding material and four second sheets of shielding material are illustrated in FIG. 11, these are merely for helping understanding of the present invention, and the present invention is not limited thereto.

Meanwhile, according to the second embodiment of the present invention, the multiple sheets of shielding material may be adhered at step S204 after being arranged such that the one or more first seams are parallel to and spaced apart from the one or more second seams.

That is, referring to FIG. 11, the first seams 211-1, 211-2, and 211-3 are parallel to the second seams 221-1, 221-2, and 221-3, but may be spaced a predetermined distance apart therefrom such that they do not overlap. For example, it may be desirable to arrange each of the second seams 221-1, 221-2, and 221-3 to match the center line between two of the first seams 211-1, 211-2, and 211-3.

Meanwhile, referring to FIG. 10 again, in the method for constructing a joint between thin flexible sheets of electromagnetic shielding material according to the second embodiment, removing a non-conductive or weakly conductive coating from the second sides of the first sheets of shielding material may be further performed at step S202 before adhering the first sides of the multiple second sheets of shielding material is performed at step S204. That is, the surface of the conductive material of the first sheets of shielding material may be exposed.

Here, the non-conductive or weakly conductive coating may be a protective film or a foreign substance.

Meanwhile, referring to FIG. 10, the method for constructing a joint between thin flexible sheets of electromagnetic shielding material according to an embodiment may further include preprocessing the corner of walls by adhering a single sheet of third shielding material thereto at step S201.

Also, referring to FIG. 10, the method for constructing a joint between thin flexible sheets of electromagnetic shielding material according to an embodiment may further include postprocessing the corner of walls by adhering a single sheet of fourth shielding material thereto at step S205 after steps S202 to S204 are performed.

A detailed description of steps S201 and S205 is the same as the description made with reference to FIGS. 6 to 9, and thus will be omitted.

Third Embodiment

Figure 13:
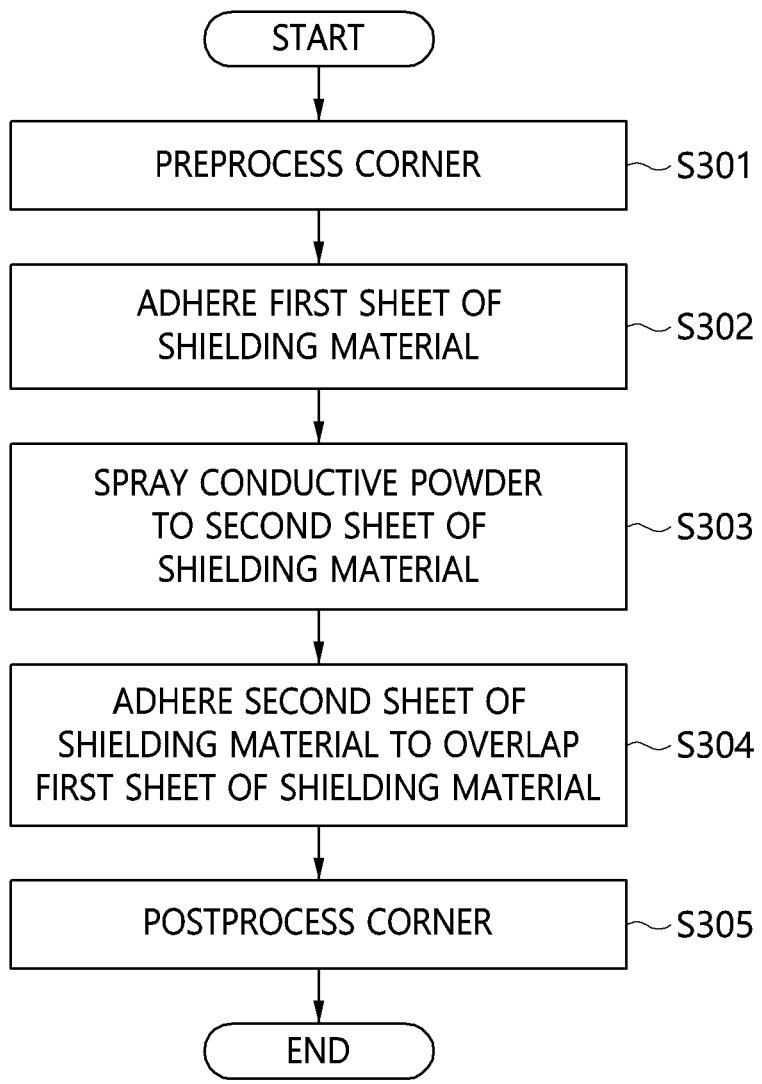
FIG. 13 is a flowchart for explaining a method for constructing a joint between thin flexible sheets of electromagnetic shielding material according to a third embodiment of the present invention.
Figure 14:
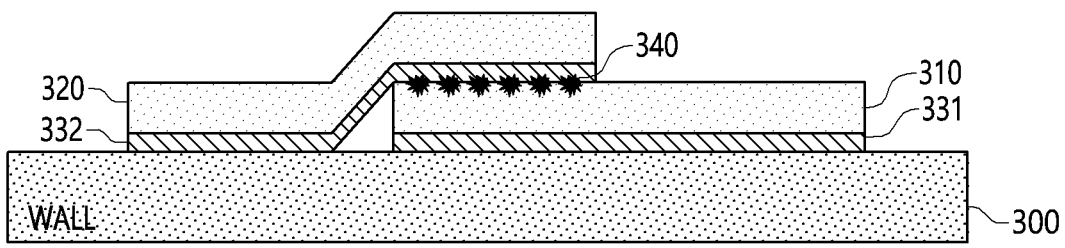
FIG. 14 is an example of a cross-sectional view of a facility in which a joint is constructed according to the third embodiment of the present invention.

FIG. 13 is a flowchart for explaining a method for constructing a joint between thin flexible sheets of electromagnetic shielding material according to a third embodiment of the present invention, and FIG. 14 is an example of a cross-sectional view of a facility in which a joint is constructed according to the third embodiment of the present invention.

Referring to FIG. 13, the method for constructing a joint between thin flexible sheets of electromagnetic shielding material according to the third embodiment may include adhering the first side of a first sheet of shielding material to a wall at step S302, spraying conductive powder to a predetermined area of the first side of a second sheet of shielding material at step S303, and adhering the first side of the second sheet of shielding material to the wall such that the predetermined area, to which the conductive powder is sprayed, overlaps the second side of the first sheet of shielding material at step S304.

That is, referring to FIG. 14, the edge areas of the first sheet of shielding material 310 and the second sheet of shielding material 320 overlap each other, but a single-layered shielding structure may be constructed. Instead, conductivity at the joint may be improved using the conductive powder 340.

Here, the wall 300 may be the wall of a facility that needs to be shielded from electromagnetic waves. However, a wall according to an embodiment may be variously interpreted as including the external surface of an object that has to be shielded from electromagnetic waves, without being limited to a wall of a building.

Meanwhile, referring to FIG. 14, a conductive adhesive or a conductive double-sided adhesive tape 331 or 332 may be applied to the first side of each of the first sheet of shielding material 310 and the second sheet of shielding material 320. For example, the first sheet of shielding material 310 and the second sheet of shielding material 320 may be produced in the form of sheets such that even laymen can easily construct a joint.

Here, the conductive powder 340 may be angular powder. This is because angular powder is more desirable than spherical powder for high cohesiveness at the joint.

Here, the conductive powder 340 may use one of a polymer, nanocarbon, and a metallic material.

Meanwhile, referring to FIG. 13, the method for constructing a joint between thin flexible sheets of electromagnetic shielding material according to an embodiment may further include preprocessing the corner of walls by adhering a single sheet of third shielding material thereto at step S301.

Also, referring to FIG. 13, the method for constructing a joint between thin flexible sheets of electromagnetic shielding material according to an embodiment may further include postprocessing the corner of walls by adhering a single sheet of fourth shielding material thereto at step S305 after steps S302 to S304 are performed.

A detailed description of steps S301 and S305 is the same as the description made with reference to FIGS. 6 to 9, and thus will be omitted.

Fourth Embodiment

Figure 15:
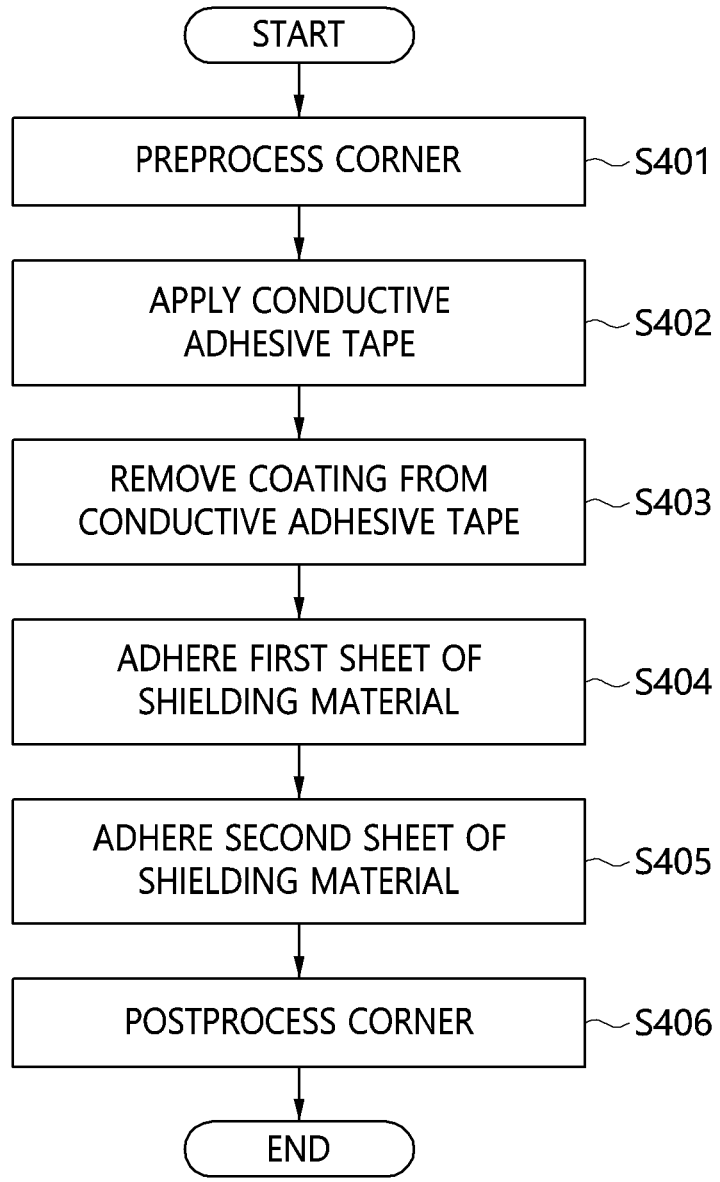
FIG. 15 is a flowchart for explaining a method for constructing a joint between thin flexible sheets of electromagnetic shielding material according to a fourth embodiment of the present invention.
Figure 16:
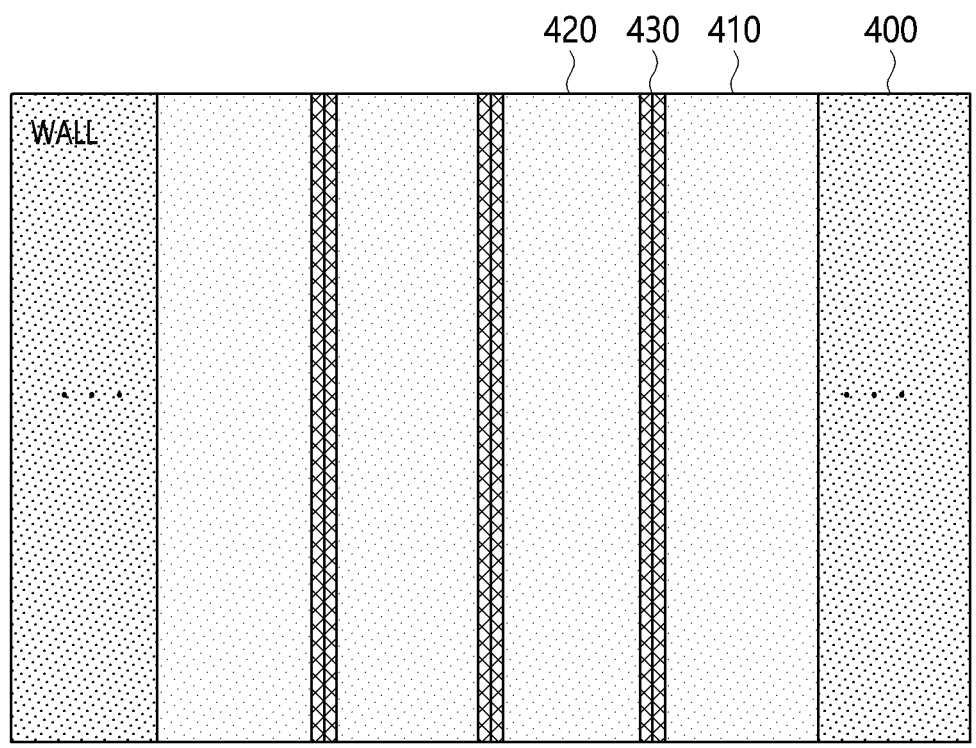
FIG. 16 is an example of a plan view of a facility in which a joint is constructed according to the fourth embodiment of the present invention.
Figure 17:
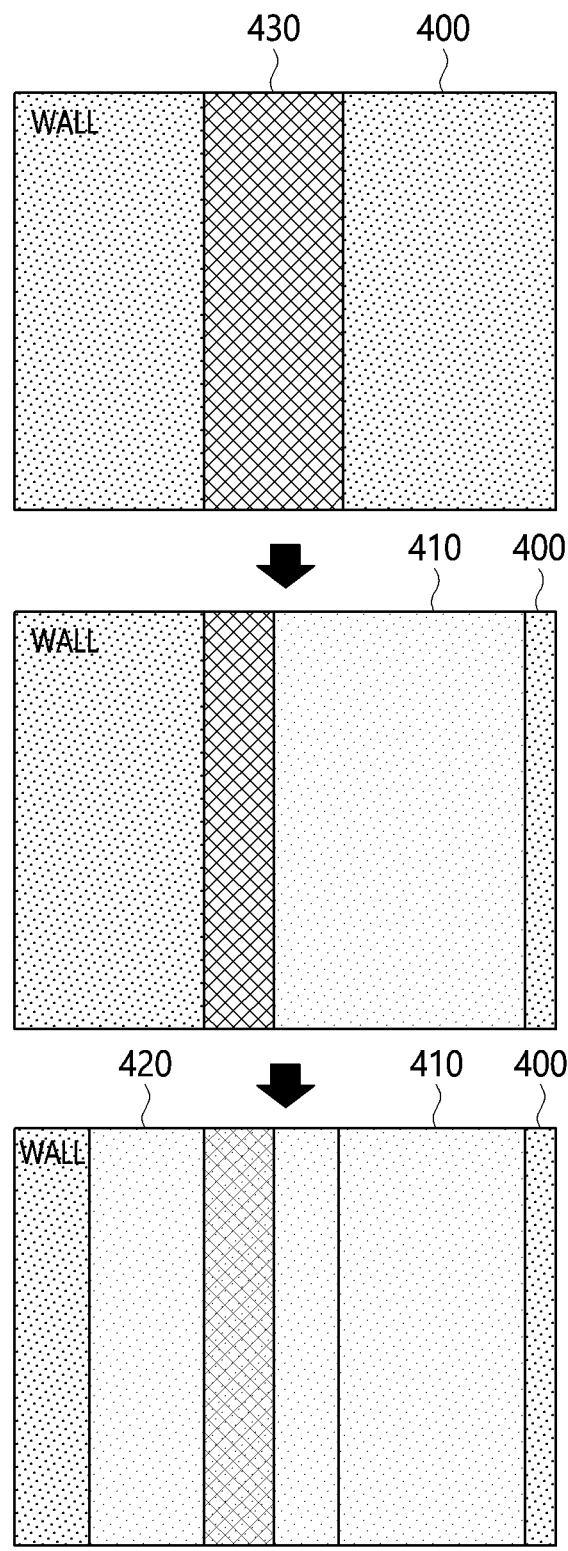
FIG. 17 is an exemplary view sequentially illustrating a process of constructing a joint according to the fourth embodiment of the present invention.

FIG. 15 is a flowchart for explaining a method for constructing a joint between thin flexible sheets of electromagnetic shielding material according to a fourth embodiment of the present invention, FIG. 16 is an example of a plan view of a facility in which a joint is constructed according to the fourth embodiment of the present invention, and FIG. 17 is an exemplary view sequentially illustrating a process of constructing a joint according to the fourth embodiment of the present invention.

The method for constructing a joint between thin flexible sheets of electromagnetic shielding material according to the fourth embodiment of the present invention, illustrated in FIG. 15, may include adhering the first side of a conductive adhesive tape to a wall at step S402, adhering the first side of a first sheet of shielding material to the wall so as to overlap a portion of the second side of the conductive adhesive tape at step S404, and adhering the first side of a second sheet of shielding material to the wall so as to overlap the remainder of the second side of the conductive adhesive tape and a portion of the second side of the first sheet of shielding material at step S405.

That is, referring to FIG. 16 and FIG. 17, a portion of the edge area of the first sheet of shielding material 410 and that of the second sheet of shielding material 420 overlap each other, but a single-layered shielding structure may be constructed. Instead, conductivity at the joint may be improved using the conductive adhesive tape 430.

Here, the conductive adhesive tape 430 may be adhered to the area in which it is expected that the first sheet of shielding material 410 and the second sheet of shielding material 420 will overlap each other in the wall 400.

Also, at step S403, the first side of the first sheet of shielding material 410 may be adhered to the conductive adhesive tape 430 such that the edge thereof matches the center line of the conductive adhesive tape 430.

Also, although not illustrated in the drawings, a conductive adhesive or a conductive double-sided adhesive tape may be applied to the first side of each of the first sheet of shielding material 410 and the second sheet of shielding material 420. For example, the first sheet of shielding material 410 and the second sheet of shielding material 420 may be produced in the form of sheets such that even laymen can easily construct a joint.

Meanwhile, referring again to FIG. 15, the method for constructing a joint between thin flexible sheets of electromagnetic shielding material according to the fourth embodiment may further include removing a coating from the second side of the conductive adhesive tape at step S403 before the first side of the first sheet of shielding material is adhered to the wall. That is, the coating or a protective film is removed from the second side of the conductive adhesive tape 430, whereby the surface of the conductive material may be exposed (the width thereof is equal to greater than 5 cm).

Meanwhile, referring to FIG. 15, the method for constructing a joint between thin flexible sheets of electromagnetic shielding material according to an embodiment may further include preprocessing the corner of walls by adhering a single sheet of third shielding material thereto at step S401.

Also, referring to FIG. 15, the method for constructing a joint between thin flexible sheets of electromagnetic shielding material according to an embodiment may further include postprocessing the corner of walls by adhering a single sheet of fourth shielding material thereto at step S406 after steps S402 to S405 are performed.

A detailed description of steps S401 and S406 is the same as the description made with reference to FIGS. 6 to 9, and thus will be omitted.

Figure 18:
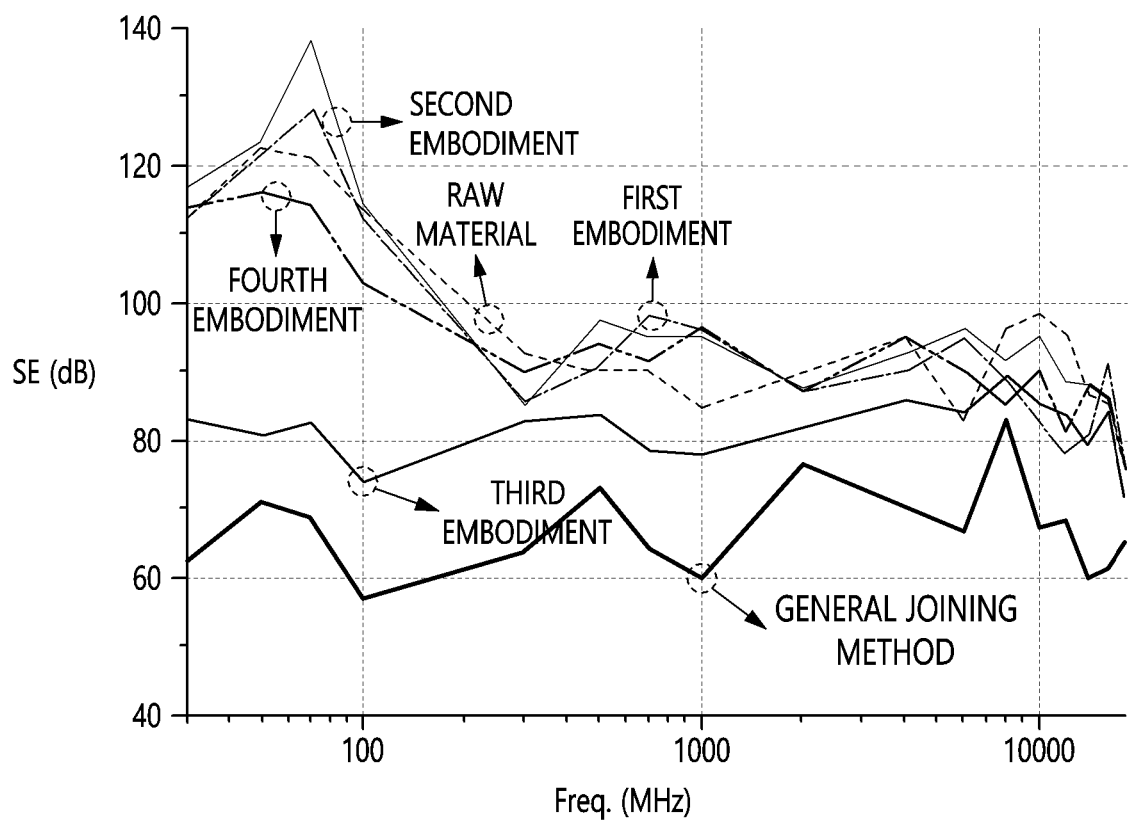
FIG. 18 is a graph illustrating the electromagnetic shielding performance of a shielding material applied using a method for constructing a joint between thin flexible sheets of electromagnetic shielding material according to an embodiment of the present invention.

FIG. 18 a graph illustrating the electromagnetic shielding performance of sheets of electromagnetic shielding material that are joined using a method for constructing a joint between thin flexible sheets of electromagnetic shielding material according to an embodiment of the present invention.

Referring to FIG. 18, the shielding performance of each of a raw shielding material, a general joint, and a shielding material according to embodiments of the present invention is illustrated, and it can be seen that, when a joint between sheets of shielding material is constructed using a general papering method, the shielding performance is significantly degraded compared to the performance of the raw shielding material.

However, when a joint is constructed according to any one of the first to fourth embodiments of the present invention, the shielding performance is improved compared to when the general joint construction method is used, and the shielding performance may be improved more than the performance of the raw shielding material according to the circumstances.

According to the disclosed embodiment, an existing method of joining sheets, which requires a special construction technique and a large number of components, is replaced with a method for a single joint of sheets of shielding material, whereby convenience may be improved.

Also, according to the disclosed embodiment, fast and easy construction may be realized thanks to a simple construction method and a minimum number of essential components, whereby an electromagnetic shielded facility may be constructed at low cost.

Also, according to the disclosed embodiment, because a thin and flexible shielding material can be directly adhered to an existing wall surface and because leakage of electromagnetic waves through a joint between sheets of material can be minimized, an electromagnetic shielded room having shielding performance equivalent to that of the material itself may be easily constructed and used as a lightweight measure for shielding against electromagnetic waves.

Also, according to the disclosed embodiment, technology for constructing an electromagnetic shielded facility using thin sheets of material, which can replace a high-cost, high-performance electromagnetic shielded facility for military/commercial purposes, may be provided, whereby computing or communications equipment may be prevented from malfunctioning or being damaged by electromagnetic waves entering from outside.

Also, according to the disclosed embodiment, a thin-film-type shielding material may be directly applied to the wall surface of an existing facility, thereby overcoming the difficulty in expanding a shielded facility, which is caused when an existing shielded facility construction method is applied to a new building or because a shielded facility has to be constructed in a separate space in a building when the existing method is applied to a facility that is being used.

Also, according to the disclosed embodiment, the shielding performance at a joint between sheets of material may be improved so as to be equivalent to that of the material itself by solving a problem in which, when a joint between sheets of shielding material is constructed using a general papering method, leakage of electromagnetic waves increases if the electromagnetic waves penetrate in a direction perpendicular to the direction in which the sheets are joined.

Also, according to the disclosed embodiment, when the walls of an electromagnetic shielded facility are constructed, an existing joining method, which requires welding or multiple components in order to connect sheets of shielding material, may be improved, whereby the number of components, other than shielding material in the form of sheets, and labor may be reduced.

Also, according to the disclosed embodiment, shielding material in the form of a sheet may cover an electromagnetic wave leakage point, whereby a problem with an existing shielded facility construction method, in which construction is time-consuming because rewelding, disassembly, or re-bolting is required at the leakage point for a remediation process and performance testing, may be simply solved.

Although embodiments of the present invention have been described with reference to the accompanying drawings, those skilled in the art will appreciate that the present invention may be practiced in other specific forms without changing the technical spirit or essential features of the present invention. Therefore, the embodiments described above are illustrative in all aspects and should not be understood as limiting the present invention.

What is claimed is:

1. A method for constructing a joint between thin flexible sheets of electromagnetic shielding material, comprising:
    adhering first sides of multiple first sheets of shielding material to a wall; and
    adhering first sides of multiple second sheets of shielding material to second sides of the multiple first sheets of shielding material,
    wherein:
    a conductive adhesive or a conductive double-sided adhesive tape is applied to the first side of each of the first sheets of shielding material and the second sheets of shielding material,
    the first sheets of shielding material are arranged in a row, each first sheet overlapping a portion of an adjacent first sheet along at least one first seam, and
    the second sheets of shielding material are arranged in a row, each second sheet overlapping a portion of an adjacent second sheet along at least one second seam,
    further comprising:
    removing a non-conductive or weakly conductive coating from the second sides of the first sheets of shielding material before adhering the first sides of the multiple second sheets of shielding material,
    wherein the non-conductive or weakly conductive coating is a protective film or a foreign substance,
    further comprising:
    preprocessing a corner of walls by adhering a single sheet of third shielding material thereto before adhering the first sides of the multiple first sheets of shielding material to the wall; and
    postprocessing the corner of the walls by adhering a single sheet of fourth shielding material thereto after adhering the first sides of the multiple second sheets of shielding material,
    wherein the third shielding material and the fourth shielding material are made of the same material as the first shielding material and the second shielding material.

2. The method of claim 1, wherein the second sheets are placed to form a predetermined angle with the first sheets such that the at least one first seam forms a predetermined angle with the at least one second seam.

3. The method of claim 2, wherein the predetermined angle falls within a range of 90°±10°.

4. The method of claim 1, wherein the first seam and the second seam are spaced a predetermined distance apart from each other so as to be parallel to each other.

5. A method for constructing a joint between thin flexible sheets of electromagnetic shielding material, comprising:
    adhering a first side of a first sheet of shielding material to a wall;
    spraying conductive powder to a predetermined area of a first side of a second sheet of shielding material; and
    adhering the first side of the second sheet of shielding material to the wall such that the predetermined area, to which the conductive powder is sprayed, overlaps a second side of the first sheet of shielding material,
    wherein:
    a conductive adhesive or a conductive double-sided adhesive tape is applied to the first side of each of the first sheet of shielding material and the second sheet of shielding material.

6. The method of claim 5, wherein:
the conductive powder is angular powder.

7. The method of claim 5, wherein:
the conductive powder uses one of a polymer, nanocarbon, and a metallic material.

8. The method of claim 5, further comprising:
preprocessing a corner of walls by adhering a single sheet of third shielding material thereto before adhering the first side of the first sheet of shielding material to the wall; and
postprocessing the corner of the walls by adhering a single sheet of fourth shielding material thereto after adhering the first side of the second sheet of shielding material.

* * * * *